(12) United States Patent
Lee et al.

(10) Patent No.: US 8,859,932 B2
(45) Date of Patent: Oct. 14, 2014

(54) LASER BEAM IRRADIATION APPARATUS FOR SUBSTRATE SEALING, SUBSTRATE SEALING METHOD, AND METHOD OF MANUFACTURING ORGANIC LIGHT EMITTING DISPLAY DEVICE USING THE SAME

(75) Inventors: Jung-Min Lee, Yongin (KR); Tae-Wook Kang, Yongin (KR)

(73) Assignee: Samsung Display Co., Ltd. (KR)

( * ) Notice: Subject to any disclaimer, the term of this patent is extended or adjusted under 35 U.S.C. 154(b) by 79 days.

(21) Appl. No.: 12/974,623

(22) Filed: Dec. 21, 2010

(65) Prior Publication Data

US 2011/0165814 A1    Jul. 7, 2011

(30) Foreign Application Priority Data

Jan. 7, 2010    (KR) .................... 10-2010-0001312

(51) Int. Cl.
  *B23K 26/00*    (2014.01)
  *B23K 26/073*    (2006.01)
  *H01L 51/52*    (2006.01)

(52) U.S. Cl.
  CPC .......... *B23K 26/073* (2013.01); *H01L 51/5246* (2013.01)
  USPC ............ 219/121.65; 219/121.75; 219/121.61; 219/121.74

(58) Field of Classification Search
  CPC ............................ B23K 26/06; B23K 26/0736
  USPC ............. 445/25; 219/121.73, 121.74, 121.75, 219/121.65
  See application file for complete search history.

(56) References Cited

U.S. PATENT DOCUMENTS 5,365,258 A * 11/1994 Murata et al. ................. 347/232
5,864,430 A *  1/1999 Dickey et al. ................. 359/559

(Continued)

FOREIGN PATENT DOCUMENTS

CN    1448753    10/2003
JP    2004119518    4/2004

(Continued)

OTHER PUBLICATIONS

Registration Determination Certificate in Chinese Application No. 201110005745.3 dated Apr. 2, 2014.

*Primary Examiner* — Mark Paschall
(74) *Attorney, Agent, or Firm* — Knobbe Martens Olson & Bear LLP

(57) ABSTRACT

A laser beam irradiation apparatus and method of manufacturing an organic light emitting display device using the same are disclosed. The laser beam irradiation apparatus is configured to irradiate a laser beam to an object extending in a first direction while moving the laser beam relative to the object in the first direction, where the laser beam has a cross-section taken in a plane perpendicular to a second direction in which the laser beam is irradiated from the apparatus, the cross-section comprising two substantially symmetrical portions that are substantially symmetrical about a centerline of the cross-section extending in the first direction, where the cross-section has a centerline length taken in the centerline, where at least part of the substantially symmetrical portions has a length in the first direction that is longer than the centerline length.

4 Claims, 15 Drawing Sheets

(56) References Cited

U.S. PATENT DOCUMENTS

| | | | |
|---|---|---|---|
| 6,639,177 B2* | 10/2003 | Ehrmann et al. | 219/121.68 |
| 7,132,375 B2* | 11/2006 | Yamazaki | 438/795 |
| 7,772,523 B2* | 8/2010 | Tanaka et al. | 219/121.8 |
| 2003/0000930 A1* | 1/2003 | Hamada | 219/121.73 |
| 2003/0059990 A1* | 3/2003 | Yamazaki | 438/166 |
| 2003/0203602 A1 | 10/2003 | Tanaka | |
| 2006/0082298 A1 | 4/2006 | Becken et al. | |
| 2007/0128967 A1* | 6/2007 | Becken et al. | 445/25 |
| 2007/0170161 A1 | 7/2007 | Yoo et al. | |
| 2007/0195634 A1 | 8/2007 | Lee | |
| 2009/0086325 A1 | 4/2009 | Liu et al. | |
| 2009/0261726 A1 | 10/2009 | Gomi | |
| 2010/0109516 A1 | 5/2010 | Warashina et al. | |

FOREIGN PATENT DOCUMENTS

| | | |
|---|---|---|
| JP | 2004306082 | 11/2004 |
| KR | 20040083293 A | 10/2004 |
| KR | 20070085333 A | 8/2007 |
| KR | 20070088671 A | 8/2007 |
| KR | 20090110231 A | 10/2009 |
| KR | 1020090128431 | 12/2009 |

* cited by examiner

LASER BEAM IRRADIATION APPARATUS FOR SUBSTRATE SEALING, SUBSTRATE SEALING METHOD, AND METHOD OF MANUFACTURING ORGANIC LIGHT EMITTING DISPLAY DEVICE USING THE SAME

CROSS-REFERENCE TO RELATED APPLICATIONS

This application claims the benefit of Korean Patent Application No. 10-2010-0001312, filed on Jan. 7, 2010, in the Korean Intellectual Property Office, the disclosure of which is incorporated herein in its entirety by reference.

BACKGROUND

1. Field

The present disclosure relates to a laser beam irradiation apparatus for substrate sealing, a method of sealing a substrate, and a method of manufacturing an organic light emitting display device.

2. Description of the Related Technology

Display devices are being replaced with portable, thin flat panel display devices. Among the flat panel display devices, electroluminescent display devices are self-emissive display devices which have a wide viewing angle and an excellent contrast ratio, and a high response speed, and thus are regarded as next-generation display devices. Also, an organic light emitting display device including an emission layer formed of an organic material has excellent luminosity, driving voltage, and response speed characteristics compared to inorganic light emitting display devices, and may realize multiple colors.

Typical organic light emitting display devices have a structure in which at least one organic layer including an emission layer is interposed between two electrodes.

When water or oxygen from the outside penetrates through the organic light emitting display device, the electrode material may be oxidized or exfoliation may occur, and this may reduce the lifespan and light emitting efficiency of the organic light emitting device, and light emitting colors may be deteriorated.

When manufacturing an organic light emitting display device, an organic light emitting device is usually sealed so as to isolate the organic light emitting device from the outside and so that water does not penetrate therein. Examples of the sealing process include a method in which an inorganic thin film and an organic polymer such as polyester (PET) are laminated on a second electrode of an organic light emitting display device, and a method in which an absorbent is formed in an encapsulation substrate and nitrogen gas is filled in the encapsulation substrate and then a boundary of the encapsulation substrate is sealed using a sealant such as epoxy.

It is virtually impossible to completely block elements such as water or oxygen penetrating from the outside, using the above methods, and the methods are not suitable for organic light emitting display devices which are particularly vulnerable to water. The process for realizing the example methods above may also be complicated. In order to address these problems, a method in which frit is used as a sealant to improve adhesive properties between a substrate of the organic light emitting device and an encapsulation substrate has been designed. By sealing an organic light emitting display device by coating frit on a glass substrate, the substrate of the organic light emitting device and the encapsulation substrate are completely sealed, thereby effectively protecting the organic light emitting display device.

A substrate is sealed using frit by coating the frit on a sealing unit of each of organic light emitting display devices and irradiating a laser beam onto the sealing unit by moving a laser beam irradiation apparatus to irradiate the laser beam onto the sealing unit, thereby hardening the frit and sealing the substrate.

SUMMARY OF CERTAIN INVENTIVE ASPECTS

Embodiments of the present invention provide a laser bean irradiation apparatus including a beam profile that improves temperature uniformity of a cross-section of glass frit, a method of sealing a substrate using the laser beam irradiation apparatus, and a method of manufacturing an organic light emitting display device.

According to an aspect of the present invention, there is provided a laser beam irradiation apparatus that irradiates a laser beam to a sealing unit disposed between a first substrate and a second substrate to seal the first substrate and the second substrate, wherein the laser beam has a uniform beam intensity and a beam profile that has a shape having two sides in the middle of the beam profile that are symmetrically concavely sunk with respect to a center line of the laser beam.

The laser beam may be irradiated in the form of a spot beam.

A length of the center portion of the laser beam may be smaller than a length of a peripheral portion of the laser beam that is parallel to the center line of the laser beam.

A length of the center portion of the laser beam may be defined as an intersection of a first cylinder and a second cylinder whose centers are separated from each other, and a length of the peripheral portion of the laser beam may be defined by a length of an intersection of a portion where a standard cylinder and the first cylinder overlap, the standard cylinder having a center point at a center point of the intersection of the first and second cylinders, and a length of an intersection of a portion where the standard cylinder and the second cylinder overlap.

The first cylinder and the second cylinder may be symmetrical to a center portion of the laser beam.

A ratio of the length of the peripheral portion of the laser beam with respect to a length of the center portion of the laser beam may be greater than 1.

A scale of semi-major radiuses of the first cylinder and the second cylinder with respect to a semi-major radius of the standard cylinder may be smaller than 1.

The semi-major radius of the standard cylinder may be greater than the length of the center portion of the laser beam.

The sealing unit may comprise frit.

According to another aspect of the present invention, there is provided a method of sealing a first substrate and a second substrate by irradiating a laser beam to a sealing unit disposed between the first substrate and the second substrate, the method comprising: forming a sealing unit between the first substrate and the second substrate; focusing a laser beam on the sealing unit, wherein the laser beam has a uniform beam intensity and a beam profile having two sides in the middle of the beam profile that are symmetrically concavely sunk with respect to a center line of the laser beam; and irradiating the laser beam along a sealing line of the sealing unit.

After focusing the center line of the laser beam on a center line (FL) of the sealing line, the laser beam may be irradiated thereto by scanning along the center line of the sealing line.

The laser beam may be irradiated to the sealing unit in the form of a spot beam.

A length of the center portion of the laser beam may be shorter than a length of the peripheral portion of the laser beam that is parallel to the center line of the laser beam.

A length of the center portion of the laser beam may be defined as an intersection of a first cylinder and a second cylinder whose centers are separated from each other, and a length of the peripheral portion of the laser beam may be defined by a length of an intersection of a portion where a standard cylinder and the first cylinder overlap, the standard cylinder having a center point at a center point of the intersection of the first and second cylinders, and a length of an intersection of a portion where the standard cylinder and the second cylinder overlap.

The first cylinder and the second cylinder may be symmetrical to the center line of the laser beam.

A ratio of the length of the peripheral portion of the laser beam with respect to the length of the center line of the laser beam may be greater than 1.

A scale of semi-major radiuses of the first and second cylinders with respect to a semi-major radius of the standard cylinder may be smaller than 1.

A semi-major radius of the standard cylinder may be greater than the length of the center portion of the laser beam.

A smallest distance between the center line of the laser beam and an end portion of the sealing unit may be greater than a smallest distance between the center line of the laser beam and the peripheral portion of the laser beam.

A width (LW) of the laser beam may be greater than a width of the sealing unit.

The width (LW) of the laser beam may be 4/3 times the width of the sealing unit.

A heat flux, which is an integration value of beam intensity of the laser beam over time which is scanned and irradiated along a center line of the sealing line, may be greater at an end portion of the sealing unit than at a center portion of the sealing unit.

The sealing unit may comprise frit.

According to another aspect of the present invention, there is provided a method of manufacturing an organic light emitting display device, the method comprising: forming an organic light emitting unit between a first substrate and a second substrate; forming a sealing unit between the first and second substrates to surround the organic light emitting unit; aligning the first substrate and the second substrate; focusing a laser beam on the sealing unit, wherein the laser beam has a uniform beam intensity and a beam profile having two sides in the middle of the beam profile that are symmetrically concavely sunk with respect to a center line of the laser beam; and irradiating the laser beam along a sealing line of the sealing unit.

After focusing the center line of the laser beam on a center line (FL) of the sealing line, the laser beam may be irradiated to the center line of the sealing line by scanning along the center line of the sealing line.

The organic light emitting unit may include at least one organic light emitting device in which at least one organic layer including an emission layer is interposed between a first electrode and a second electrode.

The laser beam may be irradiated to the sealing unit in the form of a spot beam.

A length of the center portion of the laser beam may be shorter than a length of the peripheral portion of the laser beam that is parallel to the center line of the laser beam.

The sealing unit may comprise frit.

The frit may form a closed loop to surround the organic light emitting unit.

Each edge of the closed loop may be a curve having a predetermined curvature.

Each edge of the closed loop may be right-angled.

One aspect is a laser beam irradiation apparatus configured to irradiate a laser beam to an object extending in a first direction while moving the laser beam relative to the object in the first direction, where the laser beam has a cross-section taken in a plane perpendicular to a second direction in which the laser beam is irradiated from the apparatus, the cross-section including two substantially symmetrical portions that are substantially symmetrical about a centerline of the cross-section extending in the first direction, where the cross-section has a centerline length taken in the centerline, where at least part of the substantially symmetrical portions has a length in the first direction that is longer than the centerline length.

The laser beam may have a substantially uniform beam intensity in the cross-section.

The laser beam irradiation apparatus may be configured to irradiate the laser beam in the form of a spot beam.

Each of the substantially symmetrical portions may include a first section and a second section, where lengths of the first section measured in the first direction gradually increases as measuring away from the centerline, and where lengths of the second section measured in the first direction gradually decrease as measured away from the centerline.

The object may be a frit, used for sealing two opposing glass substrates.

Another aspect is a method of manufacturing an organic light emitting display device, the method including: providing an unfinished device including a first substrate, a second substrate and a sealing unit between the first substrate and the second substrate, where the sealing unit includes an elongated segment having two edge lines extending generally in a first direction and further having an imaginary centerline extending in the first direction between the two edge lines, where the elongated segment includes two edge portions, a center portion and two middle portions along a second direction perpendicular to the first direction, where the two edge portions are located next to the two edge lines respectively, where the center portion is located on and next to the centerline, where each of the middle portions is located between the center portion and one of the two edge portions, irradiating a laser beam onto the elongated segment while moving the laser beam along the first direction relative to the elongated segment, where the laser beam is shaped such that the center portion is exposed to the laser beam for a shorter period than at least one of the middle portions and the edge portions.

The center portion may be exposed to the laser beam for a shorter period than the middle portions.

The center portion may be exposed to the laser beam for a shorter period than the edge portions.

The middle portions may be exposed to the laser beam for a longer period than the center portion and the edge portions.

The laser beam may have a cross-section taken in a plane defined by the first and second directions, the cross-section including two substantially symmetrical portions that are substantially symmetrical about a centerline of the cross-section extending in the first direction, where the cross-section has a centerline length taken in the centerline of the cross-section, where at least part of the substantially symmetrical portions have a length in the first direction that is longer than the centerline length.

The laser beam may have a substantially uniform beam intensity in the cross-section.

Each of the substantially symmetrical portions may include a first section and a second section, where lengths of the first section measured in the first direction gradually increases as measuring away from the centerline, and where lengths of the second section measured in the first direction gradually decrease as measured away from the centerline.

A width of the laser beam may be greater than a width of the sealing unit.

A width of the laser beam may be 4/3 times the width of the sealing unit.

A heat flux may be greater at the edge portions of the sealing unit than at the center portion of the sealing unit.

The sealing unit may include frit.

The frit may form a closed loop, where each edge of the closed loop is a curve with a predetermined curvature.

Each edge of the closed loop may be right-angled.

BRIEF DESCRIPTION OF THE DRAWINGS

The above and other features and advantages will become more apparent by describing in detail certain exemplary embodiments with reference to the attached drawings in which.

DETAILED DESCRIPTION OF CERTAIN INVENTIVE EMBODIMENTS

The present disclosure will now be described more fully with reference to the accompanying drawings, in which certain exemplary embodiments are shown.

Figure 1:
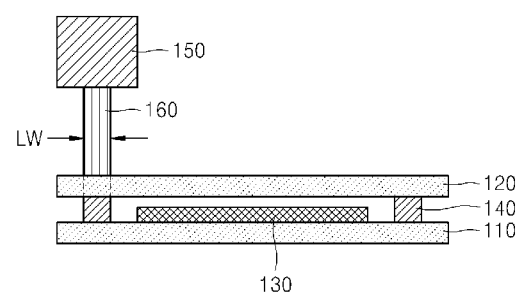
FIG. 1 is a cross-sectional view illustrating an embodiment of a method of sealing a sealing unit of an organic light emitting display device.
Figure 2:
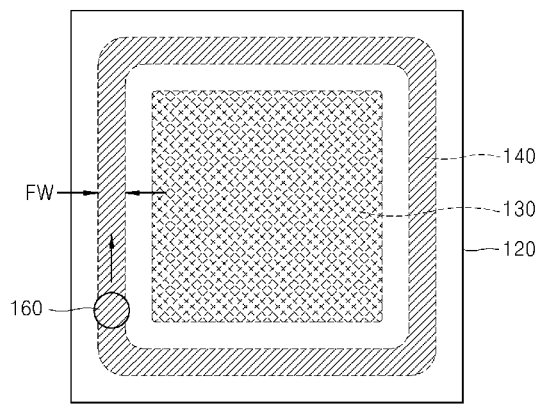
FIG. 2 is a top view of the organic light emitting device of FIG. 1.

FIG. 1 is a cross-sectional view illustrating an embodiment of a method of sealing a sealing unit of an organic light emitting display device by using a laser beam irradiation apparatus. FIG. 2 is a top view of the organic light emitting device of FIG. 1.

Referring to FIGS. 1 and 2, an organic light emitting unit 130 and a sealing unit 140 that surrounds the organic light emitting unit 130 are disposed between a first substrate 110 and a second substrate 120, and a laser beam 160 irradiated from a laser beam irradiation apparatus 150 is irradiated to the sealing unit 140.

The organic light emitting unit 130 is formed above the first substrate 110. In some embodiments, the first substrate 110 may be a glass substrate. The second substrate 120 is an encapsulation substrate that encapsulates the organic light emitting unit 130 formed above the first substrate 110, and a laser beam is transmitted therethrough. In some embodiments, the second substrate 120 may be a glass substrate.

The organic light emitting unit 130 includes at least one organic light emitting device (OLED) (not shown) in which at least one organic layer including an emission layer is interposed between a first electrode and a second electrode. The first electrode and the second electrode may function as an anode for injecting holes and a cathode for injecting electrons, respectively.

The OLED may be classified as an active matrix (AM) or a passive matrix (PM) OLED according to whether the OLED is driven using a thin film transistor (TFT) or not. Embodiments of the present invention may be used with both PM type and AM type OLEDs.

The sealing unit 140 is disposed between the first substrate 110 and the second substrate 120 to surround the above-described organic light emitting unit 130. The sealing unit 140 may be a closed loop in order to prevent contact between the organic light emitting unit 130 and water or oxygen from the outside. In one embodiment, edges of the sealing unit 140 forming the closed loop in FIG. 2 are curved with a predetermined curvature. In other embodiments, the edges of the sealing unit 140 may be right-angled without any curvature.

In embodiments where each of the edges of the sealing unit 140 has a predetermined curvature, a head (not shown) including an optical system (not shown) of the laser beam irradiation apparatus 150 may be directly and continuously scanned along a sealing line including the edges of the sealing unit 140, thereby irradiating a laser beam 160.

In embodiments where each of the edges of the sealing unit 140 is right-angled, the head (not shown) of the laser beam irradiation apparatus 150 may be scanned along a first edge of the sealing unit 140 in a first direction to irradiate the laser beam 160, and a stage under the first substrate 110, which is not illustrated in FIG. 1, is also rotated by 90 degrees. As the stage rotates, the first substrate 110 and the second substrate 120 are also rotated. The laser beam 160 is scanned and irradiated in the above-described first direction, and thus the laser beam 160 is irradiated to a second edge of the sealing unit 140. The sealing unit 140 may be sealed by irradiating the laser beam 160 while rotating the stage (not shown) in the above-described manner.

In one embodiment, the sealing unit 140 is formed of frit so as to provide tightness between the first substrate 110 and the second substrate 120 to effectively protect the organic light emitting unit 130. The frit is formed to have a predetermined frit width (FW) by using various methods such as a screen printing method or a pen dispensing method and the like.

In one embodiment, the sealing unit 140 is formed below the second substrate 120, and the organic light emitting unit 130 is formed above the first substrate 110 to align the first substrate 110 and the second substrate 120. In other embodiments, the sealing unit 140 may be formed above the first substrate 110, on which the organic light emitting unit 130 is formed, and aligned with and adhered to the second substrate 120.

In the embodiment shown in FIGS. 1 and 2, one organic light emitting unit 130 is illustrated. In other embodiments, a plurality of the organic light emitting units 130 and a plurality of the sealing units 140 may be disposed between the first substrate 110 and the second substrate 120.

In one embodiment, the laser beam irradiation apparatus 150 irradiates the laser beam in the form of a spot beam having a beam profile, to the sealing unit 140 that is disposed between the first substrate 110 and the second substrate 120. This beam irradiation will be described in detail below.

In some embodiments, the laser beam irradiation apparatus 150 may include a laser oscillator (not shown) that generates a laser, a beam homogenizer (not shown), and a scanner (not shown). The laser oscillator may be a bundle type multi core source, which is a high output laser source that is typically used for laser sealing. In embodiments using the bundle type multi-core source, output of each of cores may vary, and these non-uniform outputs may be normalized by using the beam homogenizer. The scanner may include a reflecting unit that reflects a laser beam that is irradiated from the laser oscillator, to irradiate the laser beam to the sealing unit 140, a driving unit that drives the reflecting unit, and a lens unit that collects the reflected laser beam. The laser beam 160 that is transmitted through the lens unit (not shown) is irradiated to the sealing unit 140 in the form of a spot beam having a beam profile. The lens unit may be disposed in the scanner or under the scanner so as to be oriented toward the sealing unit 140.

In embodiments where a width LW of the laser beam 160 irradiated from the laser irradiation apparatus 150 is greater than a frit width FW of the sealing unit 140, a laser mask (not shown) may be disposed between the laser beam irradiation apparatus 150 and the second substrate 120 to adjust the width LW of the laser beam 160 irradiated to the width FW of the sealing unit 140.

Figure 3:
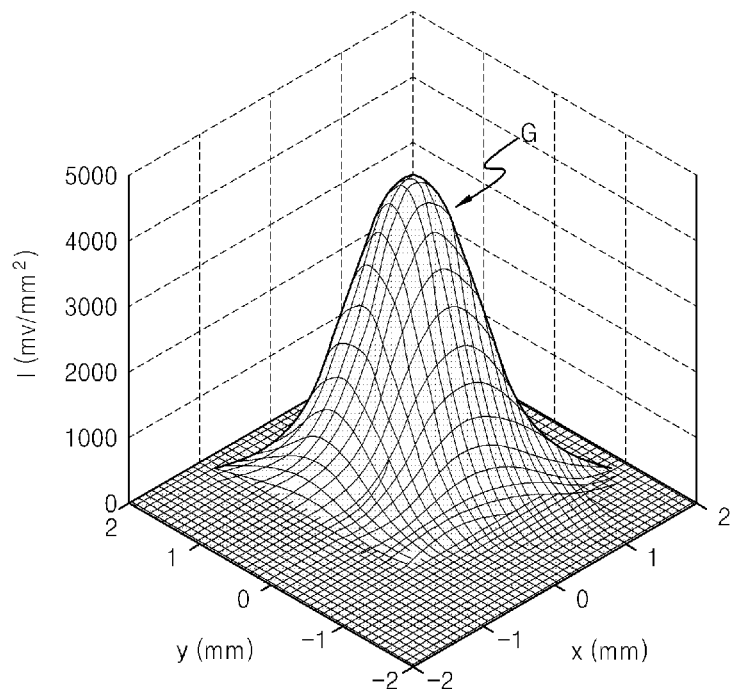
FIG. 3 illustrates a Gaussian beam profile of a comparative example of a laser beam irradiation apparatus.
Figure 4:
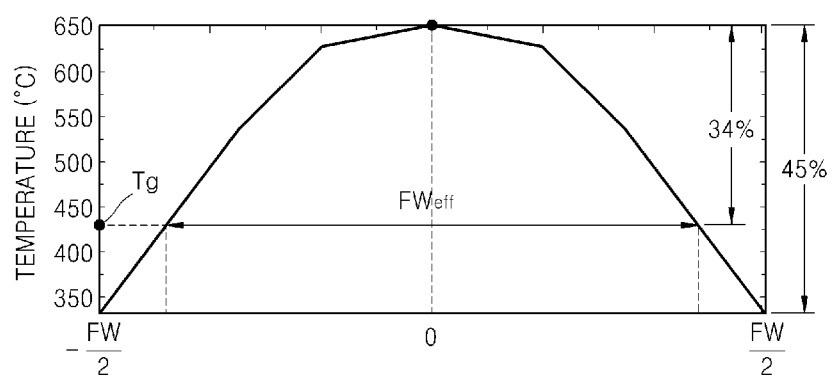
FIG. 4 illustrates a temperature distribution across a cross-section of frit when the Gaussian beam profile of FIG. 3 is irradiated to frit of an organic light emitting display device.

FIG. 3 illustrates a Gaussian beam profile of a comparative example of a laser beam irradiation apparatus. FIG. 4 illustrates a temperature distribution across a cross-section of frit when the Gaussian beam profile of FIG. 3 is irradiated to frit of an organic light emitting display device;

Referring to FIG. 3, a beam intensity (I) of the Gaussian beam profile G having a Gaussian distribution per unit surface increases toward a center portion of a beam, and the Gaussian beam profile G has an axis-symmetrical distribution.

In the graph of FIG. 3, x and y on the plane refer to horizontal and vertical dimensions of a beam profile, and even when a portion of the Gaussian beam profile (G) around a central axis is cut using a laser mask, there is still a difference of about 15% or more between a center portion of the Gaussian beam profile and a peripheral portion thereof that is cut using the laser mask.

When irradiating a laser beam, which has a difference in beam intensity between the center portion and the peripheral portion of the beam profile, onto frit that constitutes the sealing unit 140, there is a temperature difference of about 45% or more between a center portion of the frit (at 0 on the horizontal axis) and an end portion of the frit (at ±FW/2 on the horizontal axis) as illustrated in FIG. 4, and there is a maximum temperature difference of about 34% between the center portion and the end portion of the frit within an effective sealing width FWeff which corresponds to about 80% of a total sealing width FW.

Generally, a laser output is increased to maintain the end portion of the frit at a transition temperature (Tg) of the frit, at 430° C. or higher. A temperature of the center portion of the frit that is sealed by the center portion of the Gaussian beam profile increases to about 650° C. or higher, and thus excessive heat is generated and thus the frit reaches an over-welding state.

If such excessive heat is generated, small voids that exist on the center portion of the frit to which excessive energy is irradiated expand beyond the end portion of the frit, and the expanded small voids are rapidly cooled again, leaving marks that appear to be boiling bubbles. These bubble marks significantly decrease the adhesive force of the frit of the organic light emitting display device.

Residual stress is determined by heat expansion rate and difference in the temperature of the frit between the center portion and the end portion of the frit, where temperatures are reduced. Since the center portion of the frit, which is heated to a higher temperature than the end portion of the frit, is cooled later than the end portion of the frit, tensile stress of the center portion of the frit is increased, and thus cracks may be generated in the frit if an impact from the outside occurs.

In order to alleviate these problems, irradiation of a laser beam having a profile with a uniform beam intensity to the frit may be considered.

Figure 5:
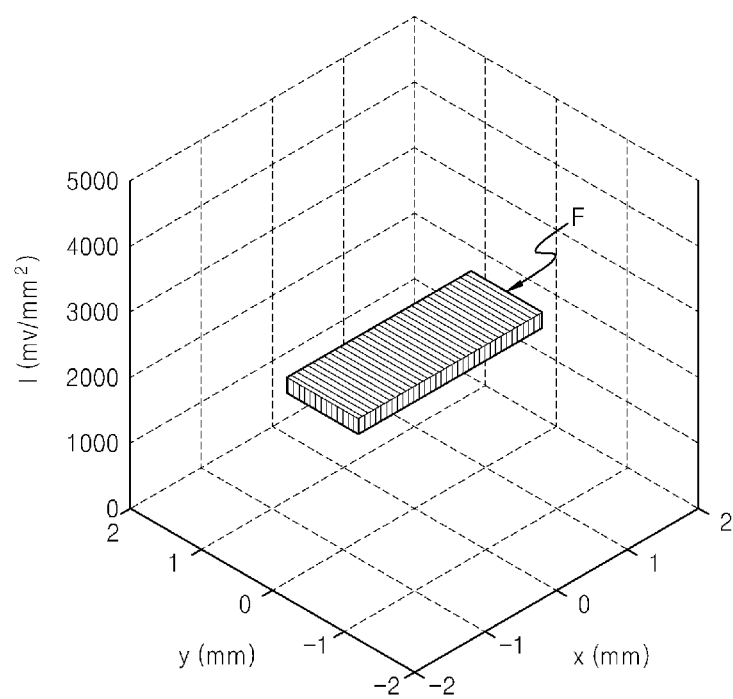
FIG. 5 illustrates a flat top beam profile of another comparative example of a laser beam irradiation apparatus.
Figure 6:
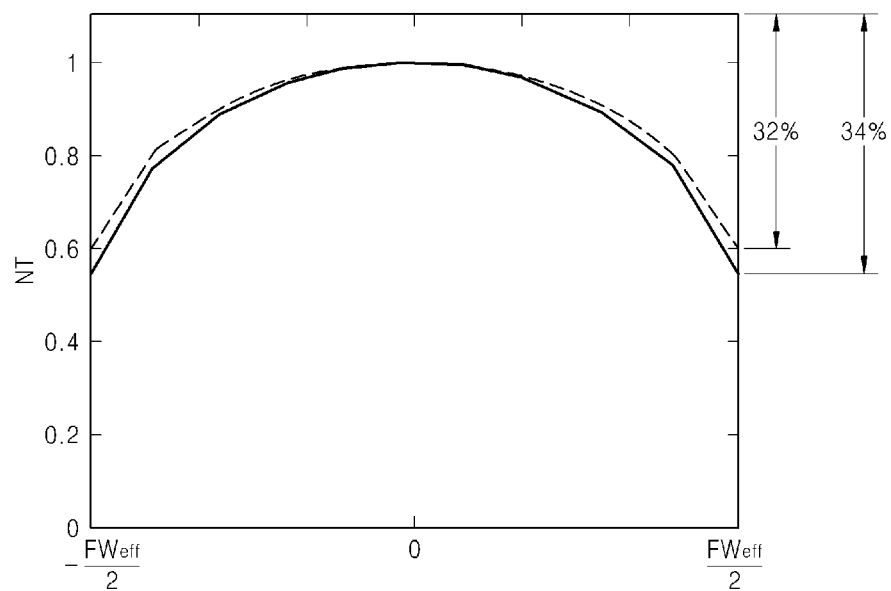
FIG. 6 illustrates normalization of temperature distribution across a cross-section of frit within an effective sealing width FWeff when the flat top beam profile of FIG. 5 and the Gaussian beam profile of FIG. 3 are irradiated to frit of an organic light emitting display device.

FIG. 5 illustrates a flat top beam profile irradiated from another comparative example of a laser beam irradiation apparatus. FIG. 6 illustrates normalization of temperature distribution across a cross-section of frit within an effective sealing width FWeff when the flat top beam profile of FIG. 5 and the Gaussian beam profile of FIG. 3 are irradiated to frit of an organic light emitting display device.

Referring to FIG. 5, a laser beam profile F has a flat top distribution in which beam intensities (I) of a center portion of a beam and a peripheral portion of the beam per unit surface are uniform.

The horizontal axis of FIG. 6 denotes a position of the frit within the effective sealing width FWeff, and the vertical axis NT denotes normalization of temperature. Referring to FIG. 6, when the flat top laser beam F having a uniform beam intensity is irradiated to the frit, the temperature uniformity of a cross-section of the frit is reduced from about 34% to about 32%, which indicates that the temperature uniformity is barely improved. This may be explained by the fact that heat is more easily dissipated along the end portion of the frit than the center portion of the frit. In order to alleviate this problem, a uniform beam intensity is not generally needed but rather, the temperature distribution in the cross-section of the frit should be adjusted to be uniform after the laser beam has been irradiated. To this end, a larger amount of energy should be supplied to the end portion of the frit than to the center portion of the frit.

Hereinafter, embodiments of a laser beam profile in which uniformity in temperature distribution in the cross-section of the frit can be improved using a laser beam irradiation apparatus will be described with reference to FIGS. 7 through 24.

Figure 7:
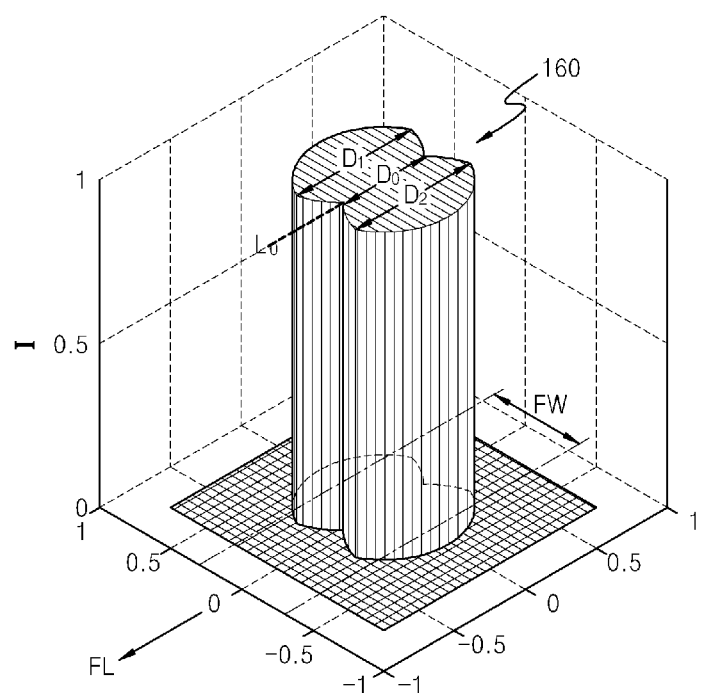
FIG. 7 is a schematic view illustrating a beam profile of a laser beam that is irradiated to frit of an organic light emitting display device from an embodiment of a laser beam irradiation apparatus.
Figure 8:
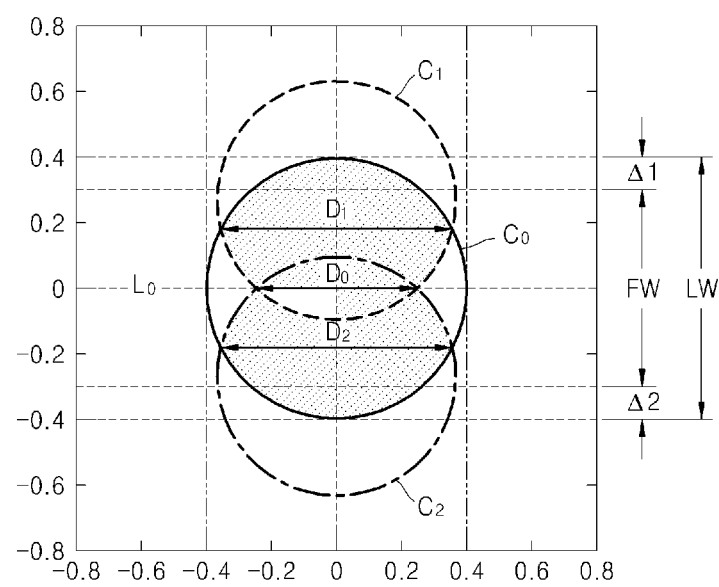
FIG. 8 is a bottom view of the beam profile of FIG. 7.

FIG. 7 is a schematic view illustrating a beam profile of a laser beam that is irradiated to frit of an organic light emitting display device in an embodiment of a laser beam irradiation apparatus. FIG. 8 is a bottom view of the beam profile of the laser beam of FIG. 7.

The horizontal axis x and the vertical axis y of FIG. 7 denote a position of a beam profile with respect to a frit width FW, and a height I denotes normalization of intensity of the laser beam.

Referring to FIGS. 7 and 8, a laser beam 160 irradiated from an embodiment of a laser beam apparatus 150 to a sealing unit 140 of an organic light emitting display device has a uniform beam intensity and a beam profile which has a shape having two sides in the middle of the beam profile, which are concavely and symmetrically sunk with respect to a laser beam center line Lo.

The laser beam 160 is irradiated in the form of a spot beam, and moves by directly scanning the sealing unit 140 along a sealing line FL.

A center line Lo of the spot beam is focused on a center line of the sealing line FL, thereby scanning along a center line of the sealing line FL.

In one embodiment, a length D0 of the center portion of the laser beam 160 is shorter than lengths D1 and D2 of peripheral portions of the laser beam 160. The lengths D1 and D2 of the peripheral portions of the laser beam 160 each denote the greatest length of the peripheral portions of the laser beam 160 respectively.

Figure 9:
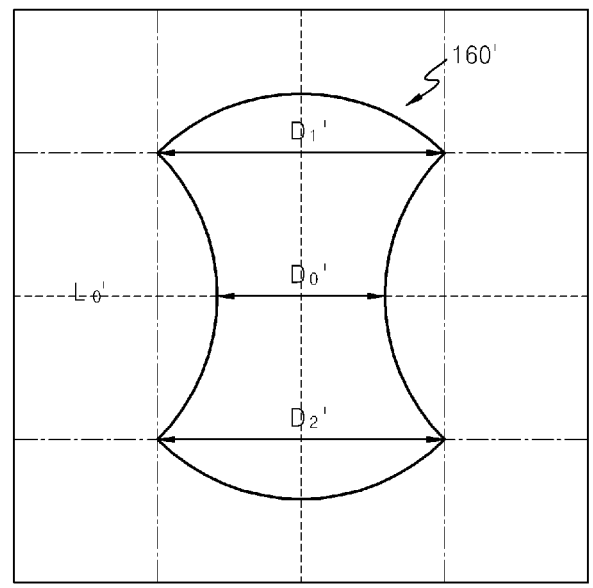
FIG. 9 is a schematic view illustrating a cross-section of another embodiment of a laser beam.

FIG. 9 is a schematic view illustrating a cross-section of another embodiment of a laser beam 160'.

Referring to FIG. 9, the laser beam 160' has a different center portion from the above-described laser beam 160 and has a uniform beam intensity. A beam profile of the laser beam 160' has a shape having two sides in the middle of the beam profile that are symmetrically concavely sunk with respect to a laser beam center line Lo'. Also, a length D0' of a center portion of the laser beam 160' is smaller than lengths D1' and D2' of peripheral portions of the laser beam that are parallel to the laser beam center line Lo'.

In such embodiments, a heat flux, which is an integration value of the intensity of laser beam over time, scanned and irradiated along a center line of a sealing line FL is greater at an end portion of the sealing unit 140 than at a center portion of the sealing unit 140. When irradiating embodiments of the laser beam 160 or 160' having the beam profiles as described above to the sealing unit 140 of the organic light emitting display device, larger energy is supplied to the end portion of the sealing unit 140 than the center portion of the sealing unit 140, thereby increasing a uniformity in the temperature of the cross-section of the frit.

The beam profile of the embodiment of the laser beam 160 illustrated in FIGS. 7 and 8 is formed of a portion of a standard cylinder C0. The center point of the cylinder coincides with the center point of the laser beam center line Lo and the cylinder overlaps with a first cylinder C1 and a second cylinder C2 which are symmetrical to the laser beam center line Lo and whose centers are separated by a predetermined distance from the laser beam center line Lo.

In the embodiments of FIGS. 7 and 8, cross-sections of the first cylinder C1, the second cylinder C2, and the standard cylinder C0 in an area with uniform beam intensity are circular. In other embodiments, the cross-sections may have shapes having predetermined curvatures, such as an oval.

The length D0 of the center portion of the laser beam 160 may represent a length of an intersection of a portion where the first cylinder C1 and the second cylinder C2, whose centers are separated from each other, overlap.

Also, the length D1 of a first peripheral portion of the laser beam 160 represents a length of an intersection of a portion where the standard cylinder C0 and the first cylinder C1 overlap, and a center point of the standard cylinder C0 coincides with a center point of the intersection of the first and second cylinders C1 and C2. The length D2 of a second peripheral portion of the laser beam 160 represents a length of an intersection of a portion where the standard cylinder C0 and the second cylinder C2 overlap. In the embodiment of FIGS. 7 and 8, the length D1 of the first peripheral portion and the length D2 of the second peripheral portion are the same.

In some embodiments, a minimum distance between the beam center line Lo and the end portion of the sealing unit 140 is greater than a greatest distance between the beam center line Lo and the lengths D1 and D2 of the first and second peripheral portions.

In some embodiments, a width LW of the laser beam is larger than a frit width FW of the sealing unit 140. In one embodiment, a frit width FW is 600 μm, and a diameter of the standard cylinder C0 corresponding to the width LW of the laser beam is 800 μm. In this embodiment, the laser beam width LW is 4/3 times the width FW of the sealing unit 140. The ratio may vary in other embodiments. If the laser beam width LW is much larger than the width of the sealing unit 140, a laser mask (not shown) needs to be used to protect wirings around the sealing unit 140 and the organic light emitting unit 130.

Figure 10:
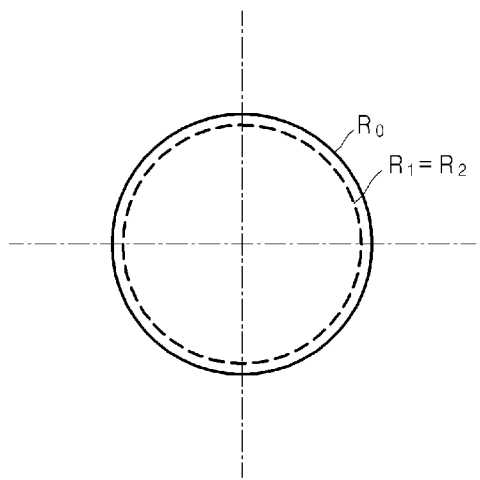
FIG. 10 illustrates a relationship between the magnitudes of semi-major radii R1 of a first cylinder and R2 of a second cylinder, and that of a semi-major radius R0 of a standard cylinder.

FIG. 10 illustrates a relationship between the magnitudes of semi-major radii R1 of a first cylinder and R2 of a second cylinder, and that of a semi-major radius R0 of a standard cylinder.

In one embodiment, the first cylinder C1 and the second cylinder C2 have the same symmetrical shape, and thus the magnitudes of the semi-major radii R1 and R2 are the same (R1=R2). Also, cross-sections of the standard cylinder C0, the first cylinder C1, and the second cylinder C2 are circles, and thus the radii R0, R1, and R2 are the same as the semi-major radiuses R0, R1, and R2.

The beam profile of one embodiment is represented by a scale of the semi-major radii R1 and R2 of the first cylinder C1 and the second cylinder C2 with respect to the standard cylinder C0, and the scale is smaller than 1. Also, the semi-major radius R0 of the standard cylinder C0 is greater than the length D0 of the center portion of the laser beam.

By designing the beam profile as described above, a heat flux, which is an integration value of an intensity of a laser beam over time, scanned and irradiated along a center line of the sealing line FL, is greater at an end portion of the sealing unit 140 than at a center portion of the sealing unit 140.

In order to quantify a difference in the heat flux, between portions of the sealing unit 140, a ratio of lengths D1 and D2 of peripheral portions of laser beam with respect to a length D0 of a center portion of the laser beam irradiated to the sealing unit 140 may be established.

The length D0 of the center portion of the laser beam and the lengths D1 and D2 of the peripheral portions of the laser beam have the same beam intensities, and thus a difference in the heat flux between portions of the sealing unit 140 may be quantified. The ratio of the lengths D1 and D2 of the peripheral portions of the laser beam to the length D0 of the center portion of the laser beam is greater than 1. The lengths D1 and D2 of the peripheral portions of the laser beam are greater than the length D0 of the center portion of the laser beam.

Figure 11:
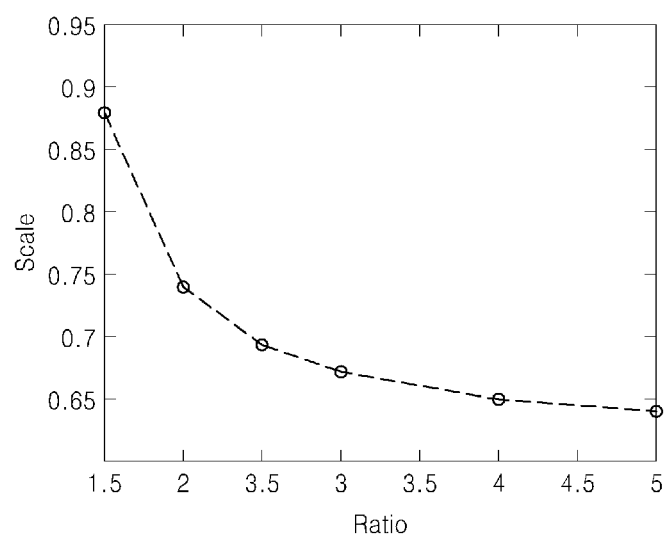
FIG. 11 is a graph showing a relationship between the scale of semi-major radii R1 of the first cylinder and R2 of the second cylinder and that of a semi-major radius R0 of a standard cylinder, and a ratio of one of lengths D1 and D2 of peripheral portions of a laser beam with respect to a length D0 of a center portion of a laser beam.

FIG. 11 is a graph showing a relationship between the scale of semi-major radii R1 of the first cylinder and R2 of the second cylinder and that of a semi-major radius R0 of a standard cylinder, and a ratio of one of lengths D1 and D2 of peripheral portions of a laser beam with respect to a length D0 of a center portion of a laser beam.

Referring to FIG. 11, the scale of the semi-major radii R1 and R2 of the first cylinder C1 and the second cylinder C2 with respect to the semi-major radius R0 of the standard cylinder C0 is inversely proportional to the ratio of the lengths D1 and D2 of the peripheral portions of the laser beam to the length D0 of the center portion of the laser beam. The greater the ratio of the lengths D1 and D2 of the peripheral portions of the laser beam to the length D0 of the center portion of the laser beam, the narrower the cross-sectional shape of the beam profile.

FIGS. 12 through 17 illustrate embodiments of a laser beam having a cross-section with uniform beam intensity with varying ratios of a length D1 of a peripheral portion of a laser beam to a length D0 of a center portion of the laser beam.

Figure 12:
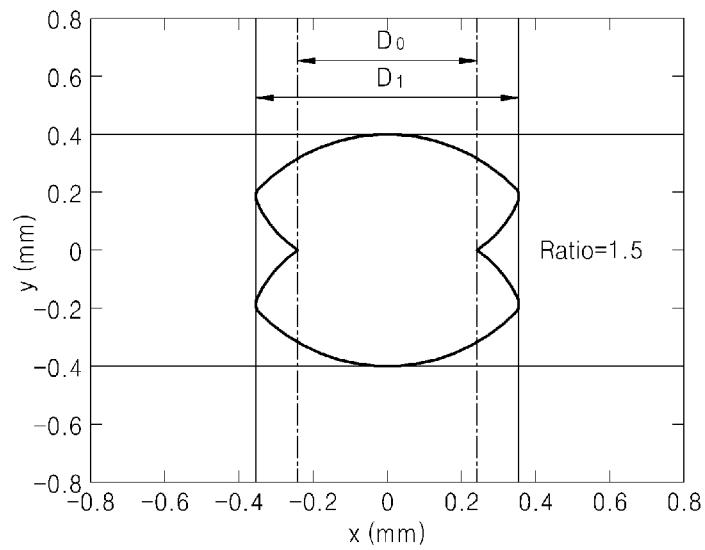
FIGS. 12 through 17 illustrate embodiments of a laser beam having a cross-section with uniform beam intensity with varying ratios of a length D1 of a peripheral portion of a laser beam to a length D0 of a center portion of the laser beam.
Figure 13:
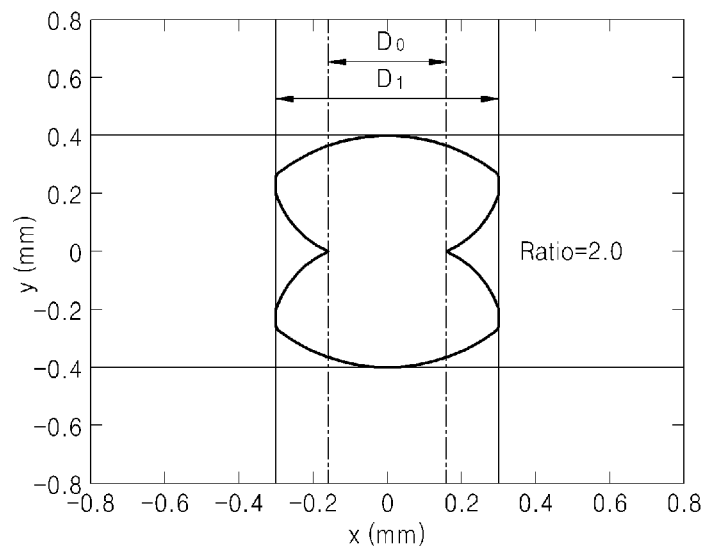
Figure 14:
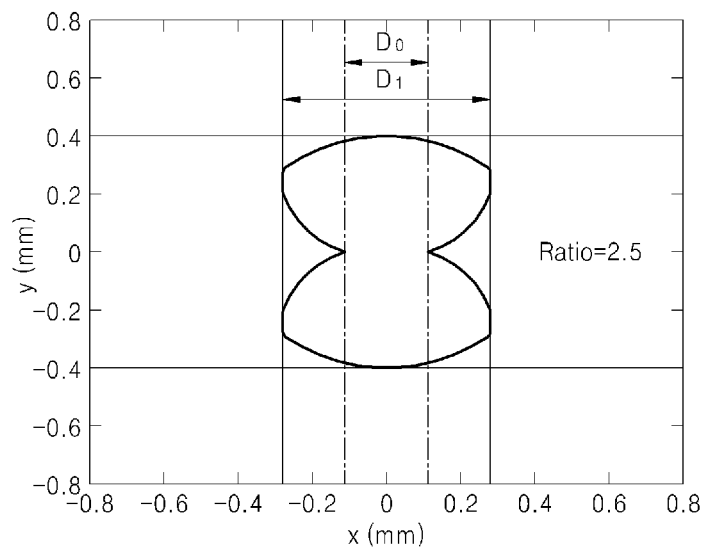
Figure 15:
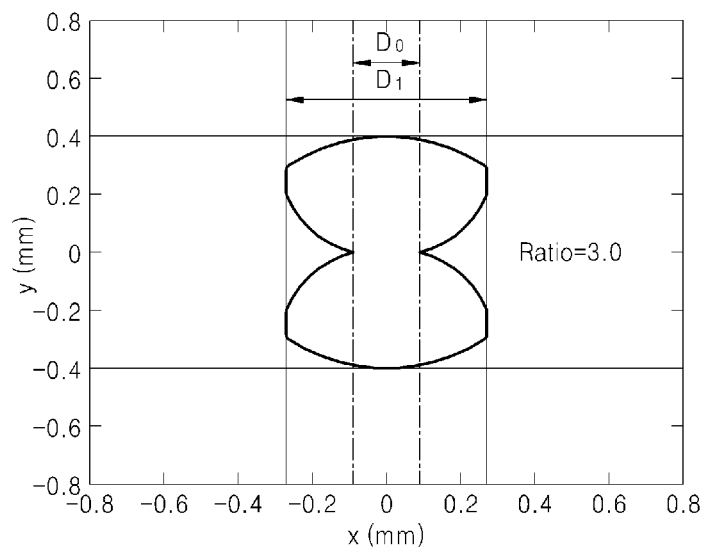
Figure 16:
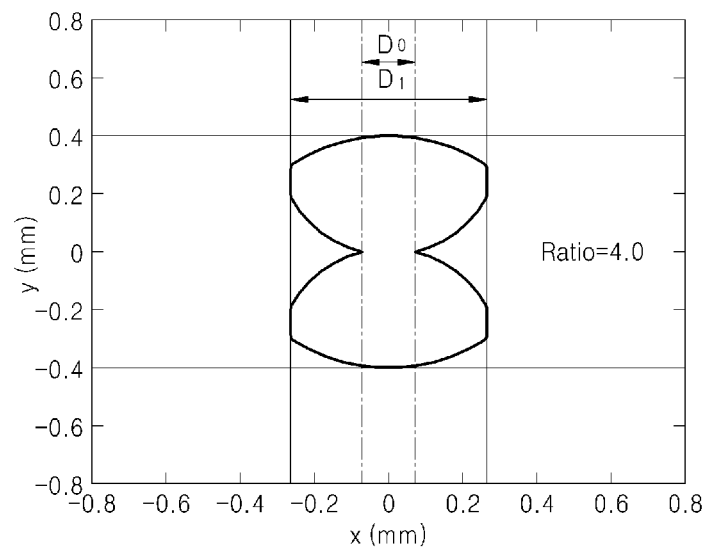
Figure 17:
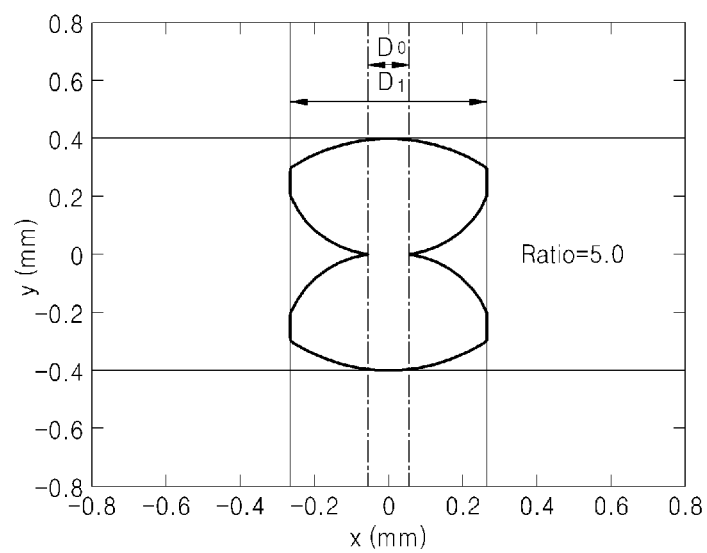

In FIG. 12, a laser beam with a ratio of 1.5 is illustrated, in FIG. 13, a laser beam with a ratio of 2.0 is illustrated, in FIG. 14, a laser beam with a ratio of 2.5 is illustrated, in FIG. 15, a laser beam with a ratio of 3 is illustrated, in FIG. 16, a laser beam with a ratio of 4 is illustrated, and in FIG. 17, a laser beam with a ratio of 5 is illustrated.

As seen in the embodiments of FIGS. 12 through 17, as the ratio of the length D1 of the peripheral portion of the laser beam to the length D0 of the center portion of the laser beam increases, a narrower beam profile is formed.

Figure 18:
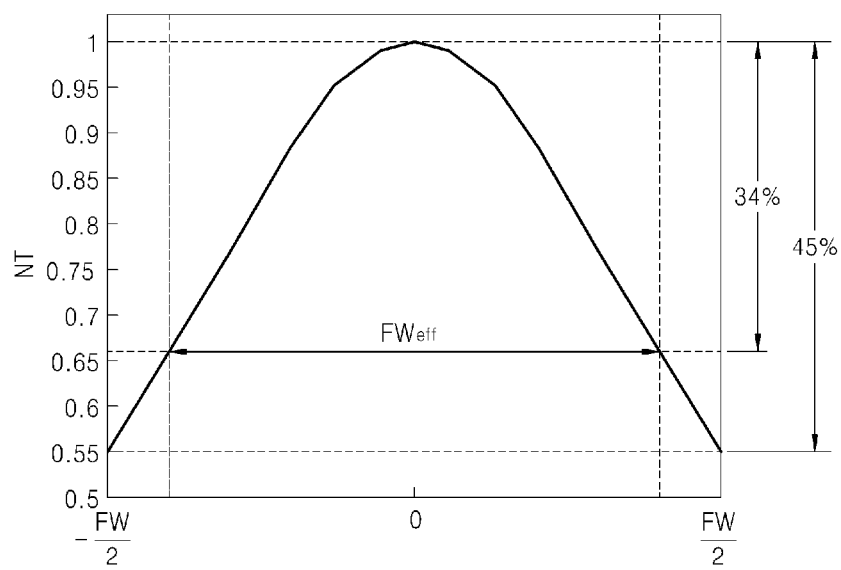
FIG. 18 illustrates normalization of temperature distribution across a cross-section of frit when the Gaussian beam profile of FIG. 3 is irradiated to an organic light emitting display device.

FIG. 18 illustrates normalization of temperature distribution across a cross-section of frit when the Gaussian beam profile of FIG. 3 is irradiated to an organic light emitting display device.

FIGS. 19 through 24 illustrate normalization of temperature distribution across a cross-section of frit for various embodiments of ratios of a length D1 of a peripheral portion of a laser beam with respect to a central length D0 of a center portion of a laser beam.

Referring to FIG. 18, when the Gaussian beam profile is used as described above, there is a temperature difference of about 45% or higher between a center portion and an end portion of the frit, and within an effective sealing frit width FWeff, there is a maximum temperature difference of about 34% between the center portion and the end portion of the frit.

Figure 19:
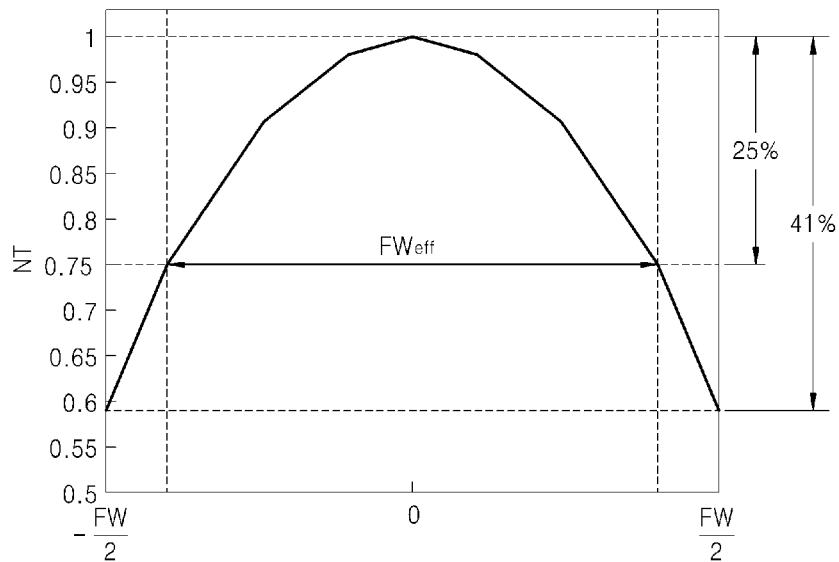
FIGS. 19 through 24 illustrate normalization of temperature distribution across a cross-section of frit for various embodiments of ratios of a length D1 of a peripheral portion of a laser beam with respect to a central length D0 of a center portion of a laser beam.

Referring to FIG. 19, in an embodiment where the ratio of the length D1 of the peripheral portion of the laser beam to the length D0 of the center portion of the laser beam is 1.5, there is a temperature difference of about 41% between the center portion and the end portion of the frit, and there is a temperature difference of about 25% between the center portion and the end portion of the frit within an effective sealing frit width FWeff. Compared to the Gaussian beam profile of FIG. 18, temperature uniformity at the end portion of the frit is improved.

Figure 20:
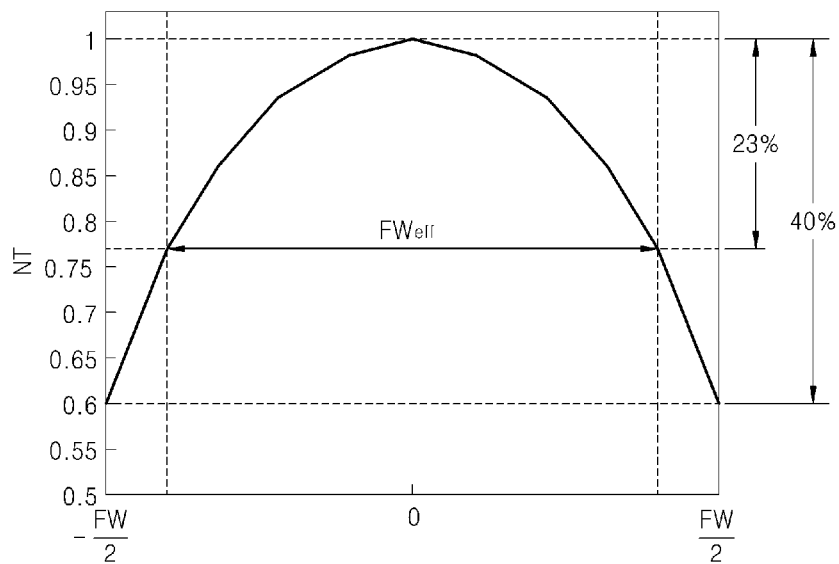

Referring to FIG. 20, in an embodiment where the ratio of the length D1 of the peripheral portion of the laser beam to the length D0 of the center portion of the laser beam is 2.0, there is a temperature difference of about 40% between the center portion and the end portion of the frit, and there is a temperature difference of about 23% between the center portion and the end portion of the frit within an effective sealing frit width FWeff. Compared to the Gaussian beam profile of FIG. 18, temperature uniformity at the end portion of the frit is further improved.

Figure 21:
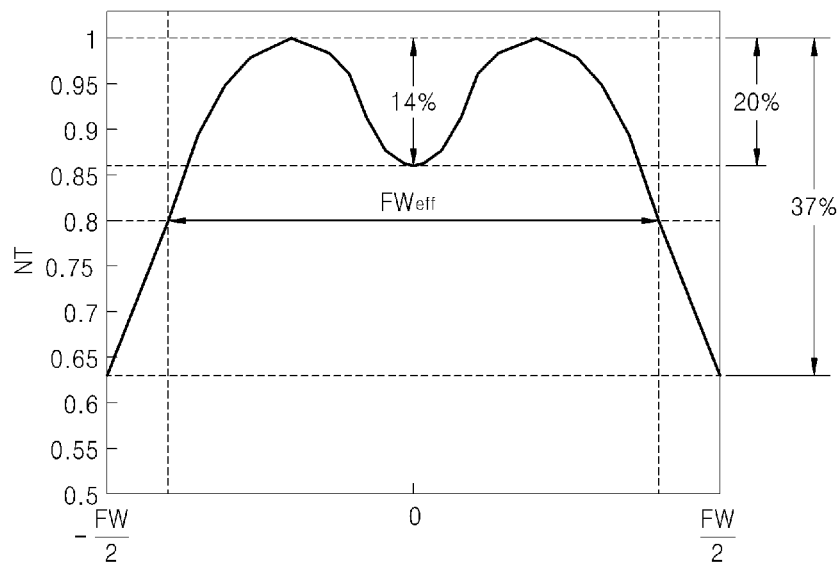

Referring to FIG. 21, in an embodiment where the ratio of the length D1 of the peripheral portion of the laser beam to the length D0 of the center portion of the laser beam is 2.5, there is a temperature difference of about 20% between the center portion and the end portion of the frit and there is a temperature difference of about 20% between the center portion and the end portion of the frit within an effective sealing width FWeff. In such an embodiment, the temperature is reduced by about 14% at the center portion of the frit but compared to the Gaussian beam profile of FIG. 18, temperature uniformity at the end portion of the frit is still improved.

Figure 22:
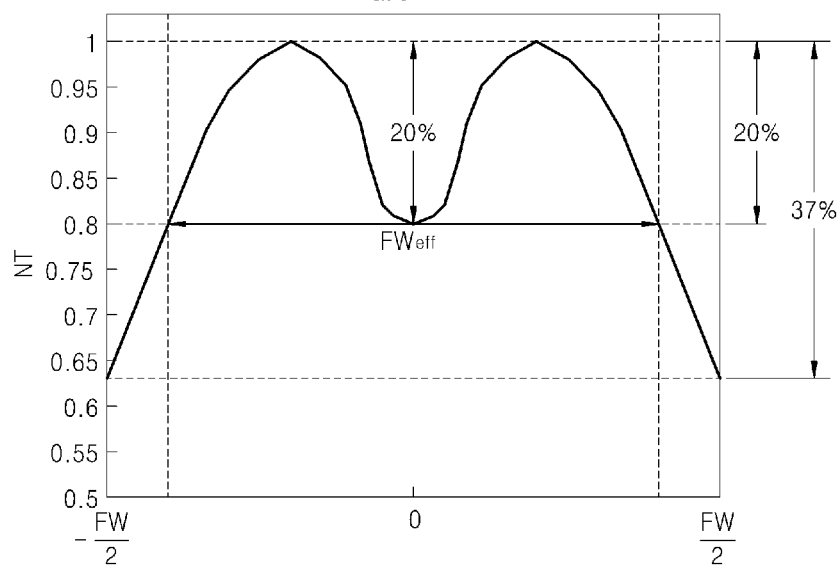

Referring to FIG. 22, in an embodiment where the ratio of the length D1 of the peripheral portion of the laser beam to the length D0 of the center portion of the laser beam is 3.0, there is a temperature difference of about 37% between the center portion and the end portion of the frit, and there is a temperature difference of about 20% between the center portion and the end portion of the frit within an effective sealing width FWeff. In such an embodiment, the temperature is reduced by about 20% at the center portion of the frit but compared to the Gaussian beam profile of FIG. 18, temperature uniformity at the end portion of the frit is still improved.

Figure 23:
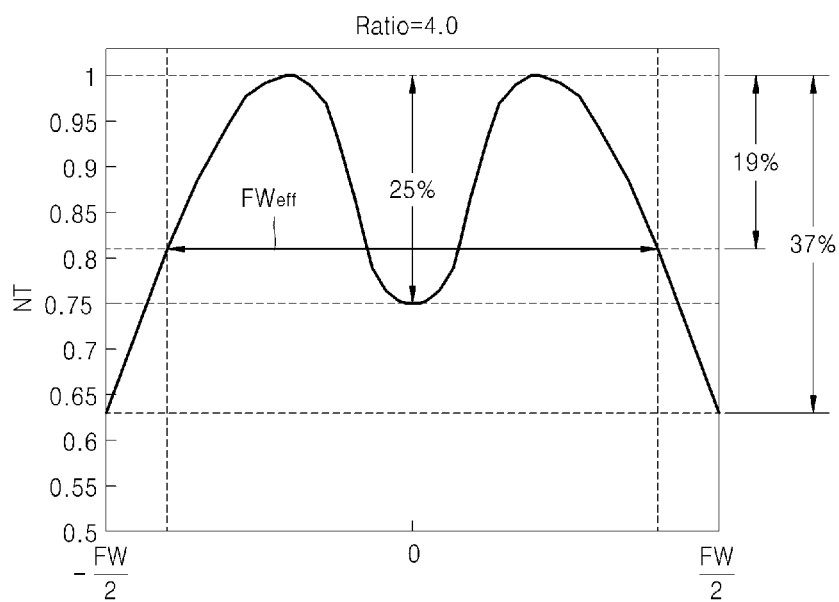

Referring to FIG. 23, in an embodiment where the ratio of the length D1 of the peripheral portion of the laser beam to the length D0 of the center portion of the laser beam is 4.0, there is a temperature difference of about 37% between the center portion and the end portion of the frit, and there is a temperature difference of about 19% between the center portion and the end portion of the frit within an effective sealing width FWeff. In such an embodiment, the temperature is reduced by about 25% at the center portion of the frit but compared to the Gaussian beam profile of FIG. 18, temperature uniformity is still improved at the end portion of the frit.

Figure 24:
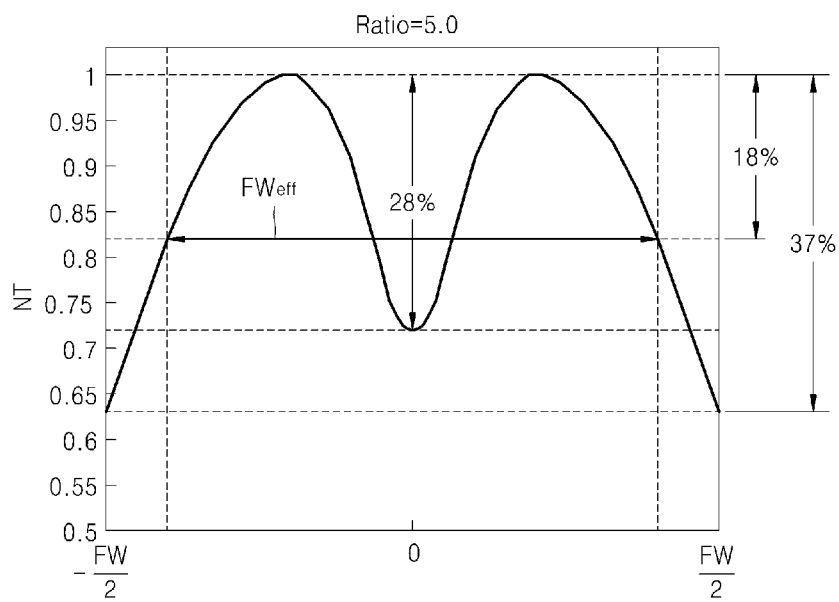

Referring to FIG. 24, in an embodiment where the ratio of the length D1 of the peripheral portion of the laser beam to the length D0 of the center portion of the laser beam is 5.0, there is a temperature difference of about 37% between the center portion and the end portion of the frit, and there is a temperature difference of about 18% between the center portion and the end portion of the frit within an effective sealing width FWeff. In such an embodiment, a temperature is reduced by about 28% at the center portion of the frit but compared to the Gaussian beam profile of FIG. 18, temperature uniformity at the end portion of the frit is still improved.

Referring to the graphs of FIGS. 19 through 24, as the ratio of the length D1 of the peripheral portion of the laser beam to the length D0 of the center portion of the laser beam is decreased, the temperature in the center portion of the frit increases more than at the peripheral portion thereof and the laser beam has a similar shape as the Gaussian beam profile; however, a temperature drop is reduced in the center portion of the frit, and as the ratio of the length D1 of the peripheral portion of the laser beam with respect to the length D0 of the center portion of the laser beam increases, the temperature drops in the center portion of the frit but the temperature uniformity along the cross-section of the frit is improved.

Accordingly, a ratio of an appropriate range of the beam profile may be selected to improve the temperature uniformity along the cross-section of the frit and to prevent the temperature drop in the center portion of the frit.

In some embodiments, the sealing unit 140 is formed using frit. In other embodiments, the sealing unit 140 may be formed using other materials known to persons of ordinary skill in the art.

The method of sealing an organic light emitting display device by using a laser beam irradiation apparatus has been described with reference to certain embodiments, but is not limited thereto. The method may also be used in various display devices, in which a sealing pattern such as frit is included between two substrates and the substrates are sealed by irradiating a laser beam to the sealing pattern.

By irradiating a laser beam having an embodiment of a beam profile to frit of an organic light emitting display device, uniformity in a temperature distribution of an end portion of the frit may be improved, thereby increasing adhesive force of the sealing unit of the organic light emitting display device.

While the present disclosure has been particularly shown and described with reference to certain exemplary embodiments, it will be understood by those of ordinary skill in the art that various changes in form and details may be made therein without departing from the spirit and scope of the present invention.

What is claimed is:

1. A laser beam irradiation apparatus comprising:
   a beam scanner comprising:
      a laser reflector configured to irradiate a laser beam in an irradiation direction to an object, and
      a driver configured to move the laser reflector relative to the object in a first direction,
   wherein the irradiated laser beam has a substantially uniform intensity across a cross-section taken in a plane perpendicular to the irradiation direction and parallel to the first direction, the cross-section of the irradiated laser beam comprising two substantially symmetrical portions that are substantially symmetrical about a centerline of the cross-section of the irradiated laser beam, wherein the cross-section has a centerline length along the centerline in the first direction, wherein each of the two substantially symmetrical portions has a maximum length in the first direction that is longer than the centerline length.

2. The laser beam irradiation apparatus of claim 1, wherein the laser reflector is configured to irradiate the laser beam in the form of a spot beam.

3. The laser beam irradiation apparatus of claim 1, wherein each of the substantially symmetrical portions of the cross section includes a first section and a second section about the part with the maximum length, wherein lengths of the first section measured in the first direction gradually increases as measuring away from the centerline toward the part with the maximum length, and wherein lengths of the second section measured in the first direction gradually decrease as measured away from the centerline and away from the part with the maximum length.

4. The laser beam irradiation apparatus of claim 1, wherein the object is a frit, used for sealing two opposing glass substrates.

* * * * *